(12) United States Patent
Wang et al.

(10) Patent No.: US 7,820,510 B2
(45) Date of Patent: Oct. 26, 2010

(54) METHOD OF FABRICATING A FLASH MEMORY AND AN ISOLATING STRUCTURE APPLIED TO A FLASH MEMORY

(75) Inventors: Shen-De Wang, Hsinchu (TW); Tzeng-Fei Wen, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/404,349

(22) Filed: Mar. 16, 2009

(65) Prior Publication Data
US 2010/0230778 A1 Sep. 16, 2010

(51) Int. Cl.
*H01L 21/336* (2006.01)

(52) U.S. Cl. .................. 438/257; 438/201; 438/211; 257/314; 257/315

(58) Field of Classification Search .......... 438/257, 438/201, 211; 257/314–316, E29.129, E29.302, 257/E21.179
See application file for complete search history.

(56) References Cited

U.S. PATENT DOCUMENTS 5,949,101 A * 9/1999 Aritome .................. 257/315
6,222,225 B1 * 4/2001 Nakamura et al. .......... 257/315
6,340,611 B1 1/2002 Shimizu et al.

OTHER PUBLICATIONS

Shimizu, K. et al., "A novel high-density 5F2 NAND STI cell technology suitable for 256 Mbit and 1 Gbit flash memories",Electron Devices Meeting, 1997. IEDM '97. Technical Digest., International,p. 271-274, Dec. 7-10, 1997.
Takeuchi, Y et al., A self-aligned STI process integration for low cost and highly reliable 1 Gbit flash memories, 1998 Symposium on VLSI Technology Digest of Technical Papers. Volume, Issue, Jun. 9-11, 1998 pp. 102-103, Jan. 1, 1998.

* cited by examiner

*Primary Examiner*—Theresa T Doan
(74) *Attorney, Agent, or Firm*—Winston Hsu; Scott Margo; Min-Lee Teng

(57) ABSTRACT

A method of fabricating a flash memory and an isolating structure applied to a flash memory is provided. The feature of the method lies in a T-shaped shallow trench isolation (STI). The T-shaped STI has a widened cap covering on a substrate and a tapered bottom embedded in the substrate. The widened cap of the T-shaped STI can provide a high process widow when fabricating the floating gate wings, and the product yield will thereby be increased.

9 Claims, 9 Drawing Sheets

METHOD OF FABRICATING A FLASH MEMORY AND AN ISOLATING STRUCTURE APPLIED TO A FLASH MEMORY

BACKGROUND OF THE INVENTION

1. Field of the Invention

The present invention relates to a method of fabricating a flash memory and an isolating structure applied to a flash memory, and more particularly, to a method and a structure that improves the process window during floating gate fabrication.

2. Description of the Prior Art

A flash memory is a non-volatile computer memory that can be electrically erased and reprogrammed. It is a technology that is primarily used in memory cards or USB flash drives, which are used for general storage and transfer of data between processors and other digital products. Scaling down of flash memory cells is considered critical to continue the trend towards high device density.

Generally speaking, the basic flash cell consists of a floating gate, a dielectric layer and a control gate stacked on a tunnel oxide layer from bottom to top in sequence. The floating gate is for charge storage, and the control gate is for controlling the charging/discharging of the floating gate. In order to increase the performance of flash, a floating gate wing is formed at two sides of the floating gate. In this way, a gate coupling ratio (GCR) is increased. The higher the GCR, the shorter the programming and erasing time that can be reached. The operation efficiency is therefore increased.

However, in 90 nm manufacturing processes, the alignment accuracy tolerance of floating gate wing fabrication must be controlled below 30 nm, which is a great challenge for conventional methods.

SUMMARY OF THE INVENTION

Therefore, it is one objective of the present invention to provide an improved flash fabrication method and an insulating structure to improve the process window of floating gate wing fabrication.

From one aspect of the present invention, a method for fabricating a flash memory comprises: providing a substrate sequentially covered by a first dielectric layer, a first conductive layer, a first mask layer and a second mask layer; forming a first trench in the second mask layer, the first mask layer, the first conductive layer, the first dielectric layer and the substrate, wherein the first trench partly formed in the second mask layer has a first width, and the first trench partly formed in the first mask layer, the first conductive layer, the first dielectric layer and the substrate has a second width, wherein the first width is wider than the second width; filling up the first trench by an insulating material, the top surface of the insulating material being on the same plane with the top surface of the second mask layer; removing the second mask layer and a part of the first mask layer, and exposing the first conductive layer; forming a second conductive layer covering the first conductive layer and the insulating layer; forming a second trench in the second conductive layer, and exposing the top surface of the insulating material; forming a second dielectric layer conformally covering the surface of the second trench and the surface of the second conductive layer; and forming a third conductive layer covering the second dielectric layer and filling up the second trench.

From another aspect of the present invention, a method for fabricating a flash memory comprises: providing a substrate sequentially covered by a first dielectric layer, a first conductive layer, a first mask layer and a second mask layer; forming a first trench in the second mask layer, the first mask layer, the first conductive layer, the first dielectric layer and the substrate, wherein the first trench partly formed in the second mask layer, the first mask layer and the first conductive layer has a first width, and the first trench partly formed in the first dielectric layer and the substrate has a second width, wherein the first width is wider than the second width; filling up the first trench by an insulating material, the top surface of the insulating material being on the same plane with the top surface of the second mask layer; removing the second mask layer and the first mask layer, and exposing the first conductive layer; forming a second conductive layer covering the first conductive layer and the insulating layer; forming a second trench in the second conductive layer, and exposing the top surface of the insulating material; forming a second dielectric layer conformally covering the surface of the second trench and the surface of the second conductive layer; and forming a third conductive layer covering the second dielectric layer and filling up the second trench.

From another aspect of the present invention, an insulating structure applied to a flash memory comprises: a substrate with a conductive layer; and a first insulating structure with a first bottom and a first cap layer, wherein the first cap layer is wider than the first bottom, and wherein the first bottom is embedded in the conductive layer and the substrate, and the first cap layer covers the conductive layer.

The present invention features a novel process to form a T-shaped STI. In other words, the STI has a widened cap layer. By doing this, the widened cap layer can increase the process window during floating gate wing fabrication.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
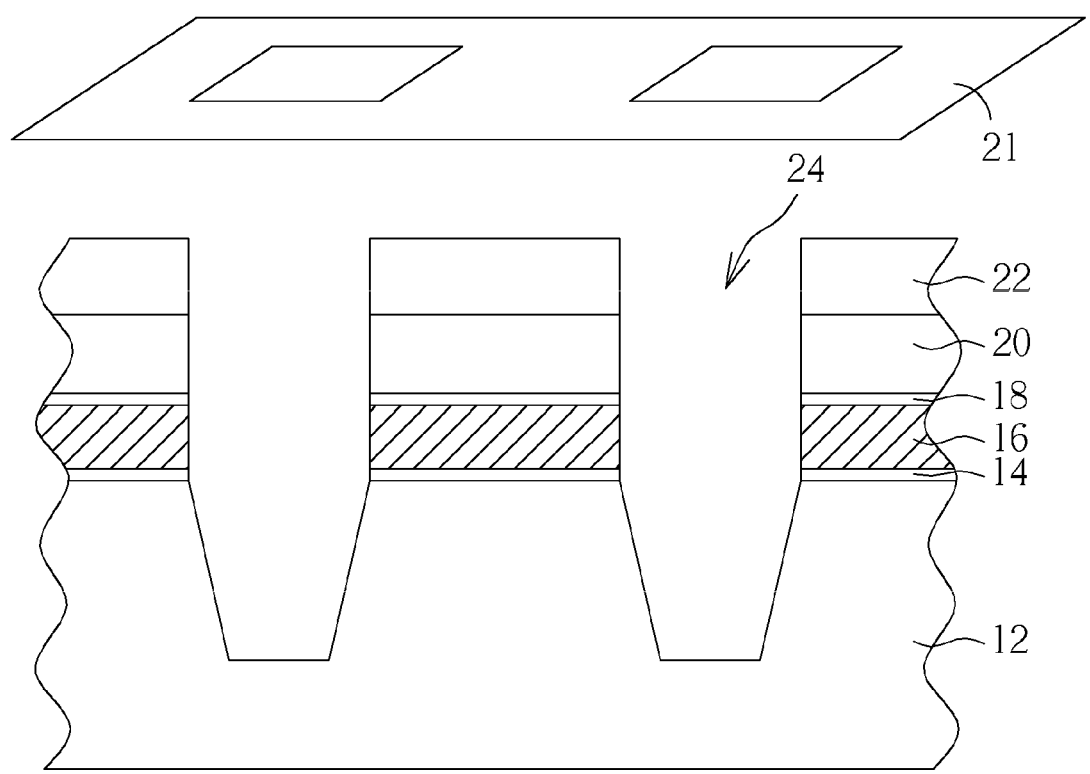
FIG. 1 to FIG. 10 are cross-sectional diagrams showing a fabricating method of a flash memory in accordance with the first preferred embodiment of this invention.

FIG. 1 to FIG. 10 are cross-sectional diagrams showing a fabricating method of a flash memory in accordance with the first preferred embodiment of this invention. As shown in FIG. 1, a substrate 12 is provided. A first dielectric layer 14, a first conductive layer 16, a first mask layer 18 and a second mask layer 20 sequentially cover the substrate 12. The substrate 12 may be silicon, silicon-on-insulator, or the like. The first dielectric layer 14 may be silicon oxide serving as a tunnel oxide layer after the flash memory is completed. The first conductive layer 16 may be polysilicon, doped polysilicon or other conductive materials. The first mask layer 18 may be silicon oxide serving as a pad oxide layer. The second mask layer 20 may be silicon nitride.

Next, a third mask layer 22 such as a photoresist is formed on the second mask layer 20. After that, the third mask layer 22 is defined by a photo mask 21. Then, after an exposure and development process, the third mask layer 22 is patterned and the pattern on the photo mask 21 is transferred onto the third mask layer 22. Next, the second mask layer 20, the first mask layer 18, the first conductive layer 16, the first dielectric layer 14 and the substrate 12 are etched to form a trench 24 by taking the patterned third mask layer 22 as a mask. Then, the third mask layer 22 is removed.

Figure 2A:
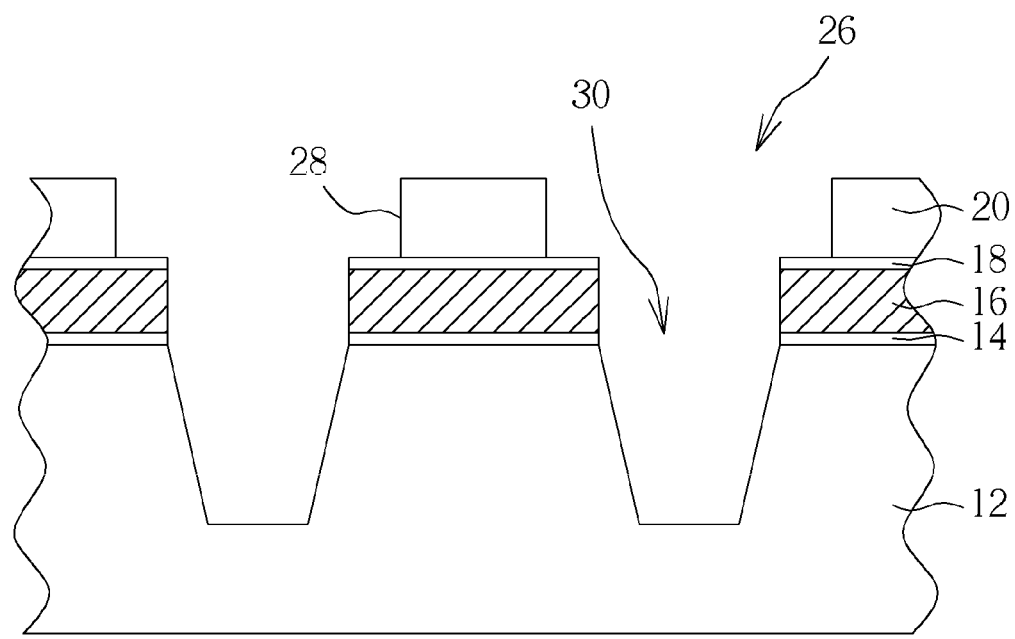

As shown in FIG. 2a, the second mask layer 20 is pulled back to form a trench 26. In this embodiment, the trench 26 is constituted by a first width 28 and a second width 30. The first width 28 and the second width 30 form a discontinuous step profile. The first width 28 is defined by the second mask layer 20 after being pulled back, and the second width 30 is defined by the substrate 12, the first dielectric layer 14, the first conductive layer 16 and the first mask layer 18. The first width 28 is wider than the second width 30. The pulling back process can be performed by any suitable process, for example, the etching process.

Figure 2B:
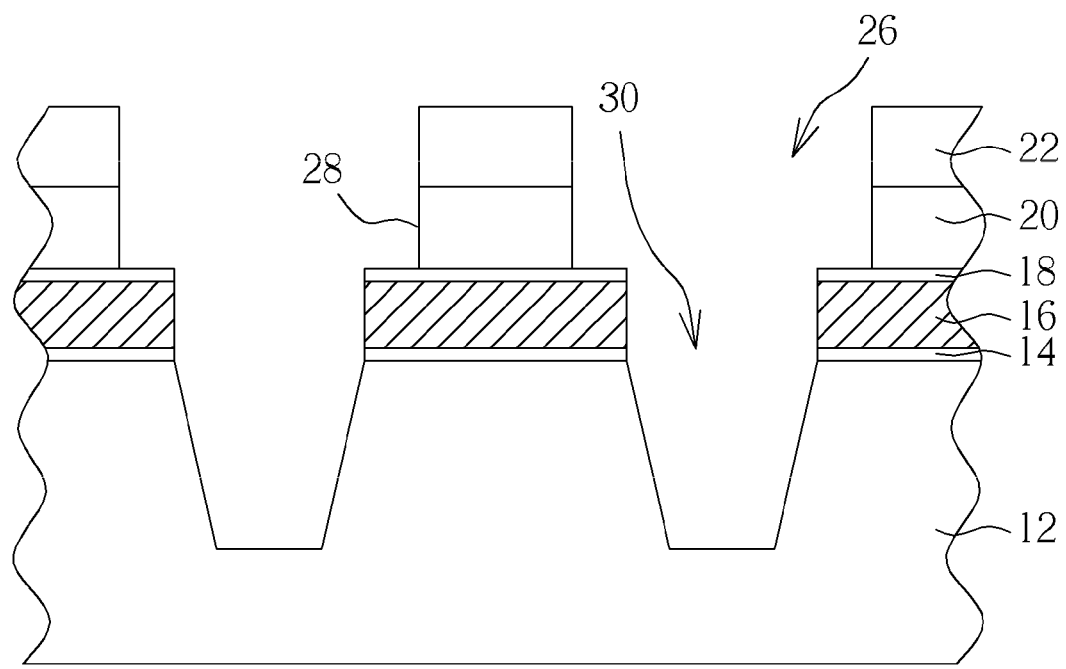

According to another preferred embodiment of the present invention, the method of forming the first width 28 can be replaced by the following steps: as shown in FIG. 2b, the third mask layer 22 is shrinked to define the first width 28 by a trimming process or a dry etching process, after the trench 24 is formed. Next, the second mask layer 20 is etched by taking the third mask layer 22 as a mask and using the first mask layer 18 as a stop layer. By doing this, the first width 28 defined by the third mask layer 22 can be transferred onto the second mask layer 20. After that, the third mask layer 22 is removed.

Figure 3:
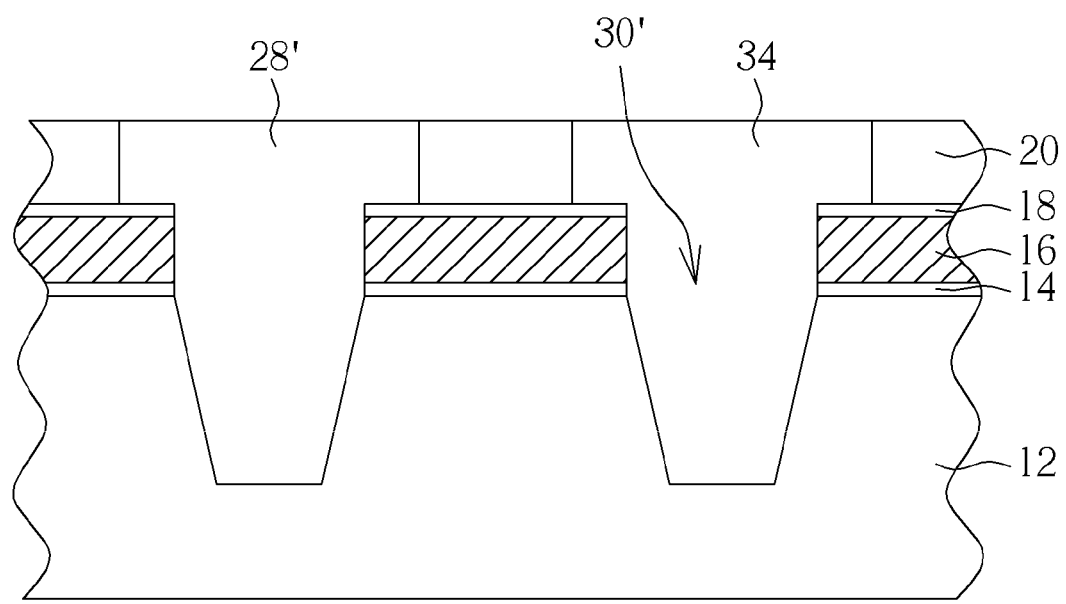

After the first width 28 and the second width 30 are formed, as shown in FIG. 3, an insulating material 34 fills up the trench 26 and covers the second mask layer 20. Then, a chemical mechanical polish (CMP) process is performed to align the surface of the insulating material 34 and the surface of the second mask layer 20 by taking the second mask layer 20 as a CMP stop layer. The insulating material 34 filling into the trench 26 also has a first width 28' and second width 30'. The first width 28' of the insulating material 34 comprises the insulating material 34 filling in the first width 28 of the trench 26, and the second width 30' comprises the insulating material 34 filling in the second width 30 of the trench 26. In the present invention, the insulating material 34 will serve as a shallow trench insulation (STI) after the flash memory is finished. Furthermore, the insulating material 34 may be silicon oxide used in STI.

Figure 4:
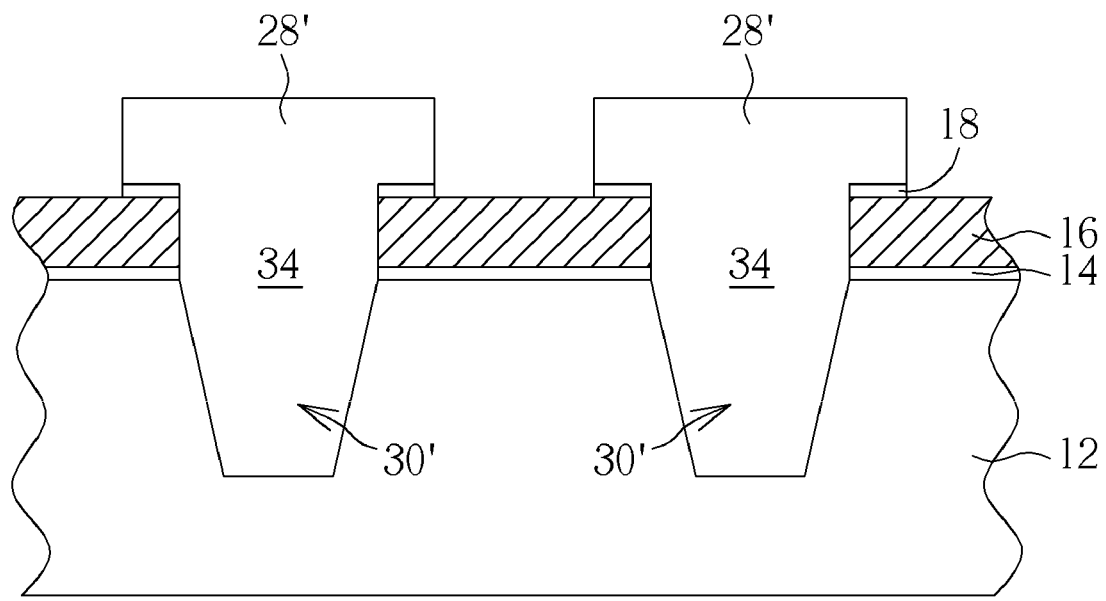
Figure 5:
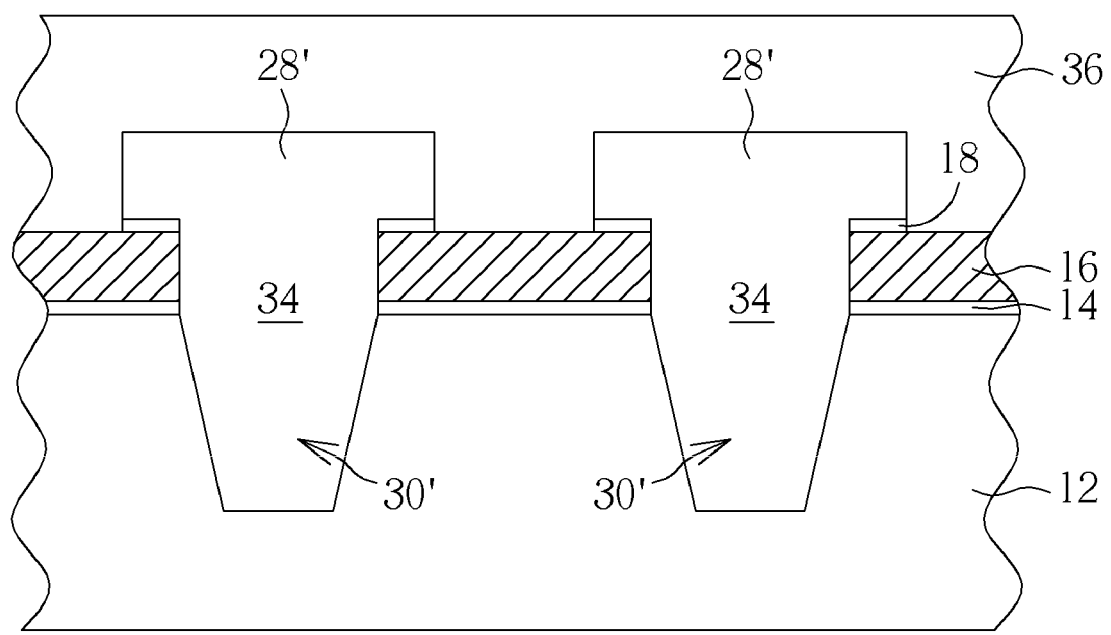

As shown in FIG. 4, the second mask layer 20 is removed completely and the first mask layer 18 is removed partly so that the surface of the first conductive layer 16 is exposed. At this point, the first width 28' of the insulating material 34 and a part of the first mask layer 18 form a cap layer covering the first conductive layer 16. As shown in FIG. 5, a second conductive layer 36 such as a polysilicon completely covers the insulating material 34 and the exposed first conductive layer 16.

Figure 6:
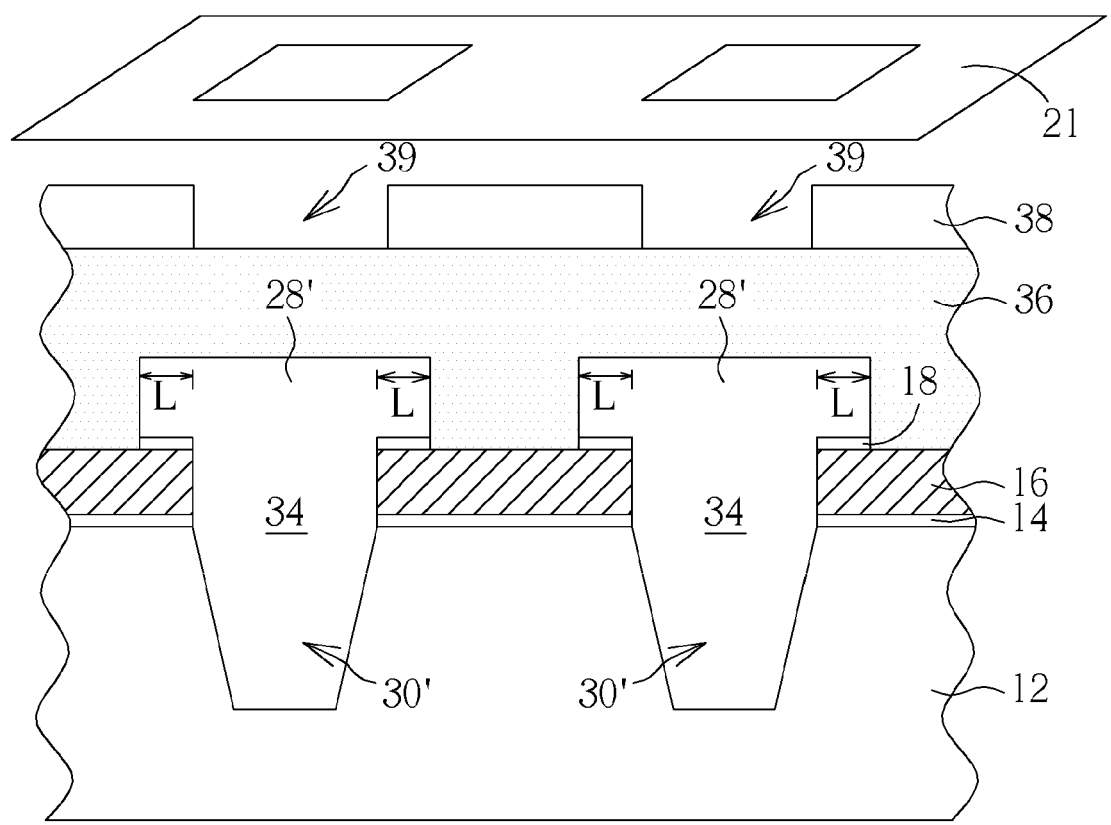
Figure 7:
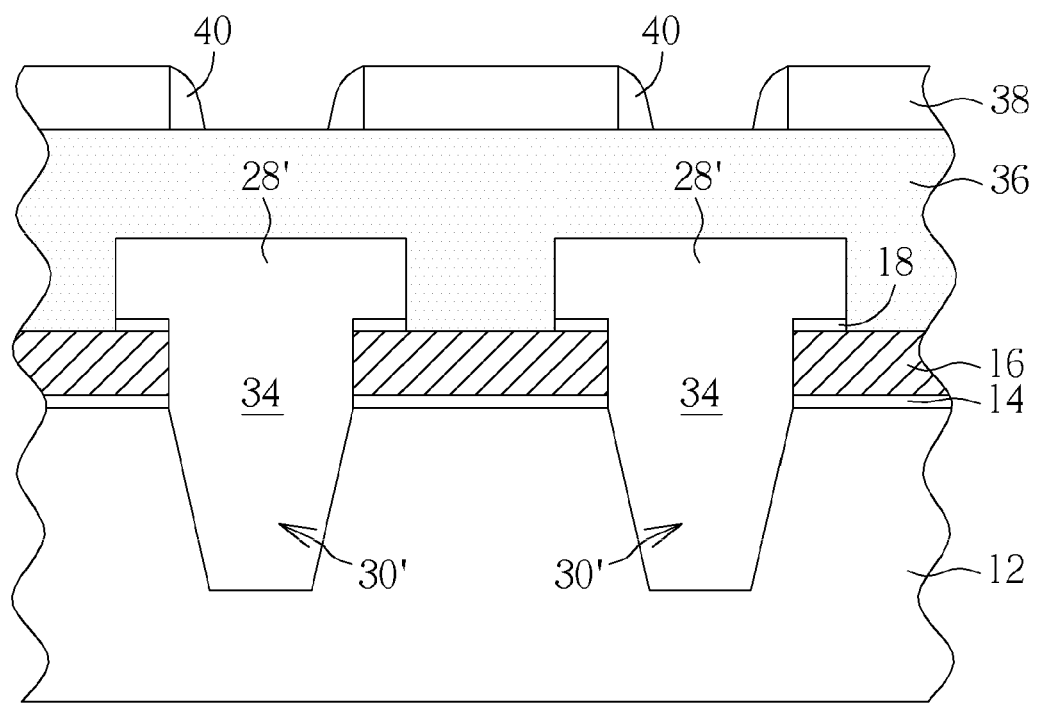

As shown in FIG. 6, a patterned fourth mask layer 38 is formed on the surface of the second conductive layer 36. In this embodiment, the fourth mask layer 38 can be patterned by the photo mask 21 used in the previous step to form a plurality of spaces 39. As shown in FIG. 7, a spacer 40 is formed at the side wall of the fourth mask layer 38 to shrink the space 39 defined by the patterned fourth mask layer 38. According to a preferred embodiment of the present invention, the spacer 40 can be formed by depositing a mask material on the surface of the patterned fourth mask layer 38 conformally and then etching the mask material anisotropically.

Figure 8:
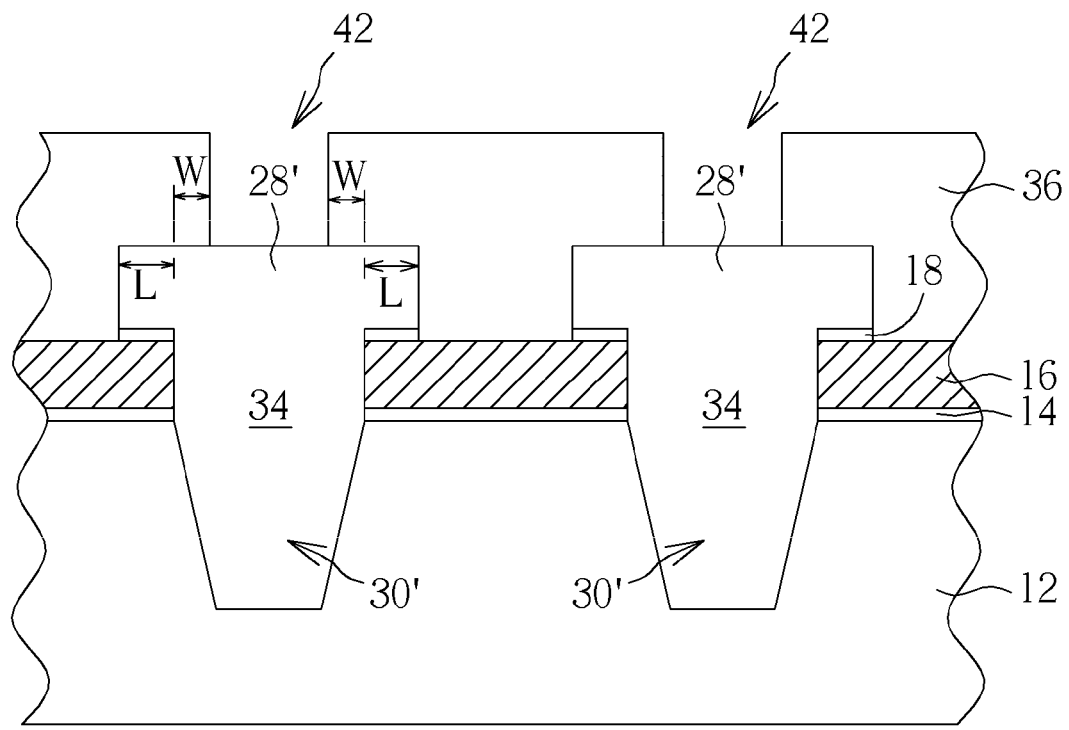

As shown in FIG. 8, then, the conductive layer 36 is etched to form a trench 42 by taking the fourth mask layer 38 and the spacer 40 as mask. By forming the trench 42, a floating gate wing W is formed. The floating gate wing W is disposed in a part of the second conductive layer 36, more particularly, the floating gate wing W is disposed in a part of the second conductive layer 36 covering on the insulating material 34. It is noteworthy that a width L which is a part of the first width 28' of the insulating material 34 is formed by the previous pulling back process. Because of the width L, the process window of forming the floating gate wing W is increased. That is, when defining the position of the space 39 illustrated in FIG. 6, the alignment accuracy tolerance can be increase due to the width L.

Figure 9:
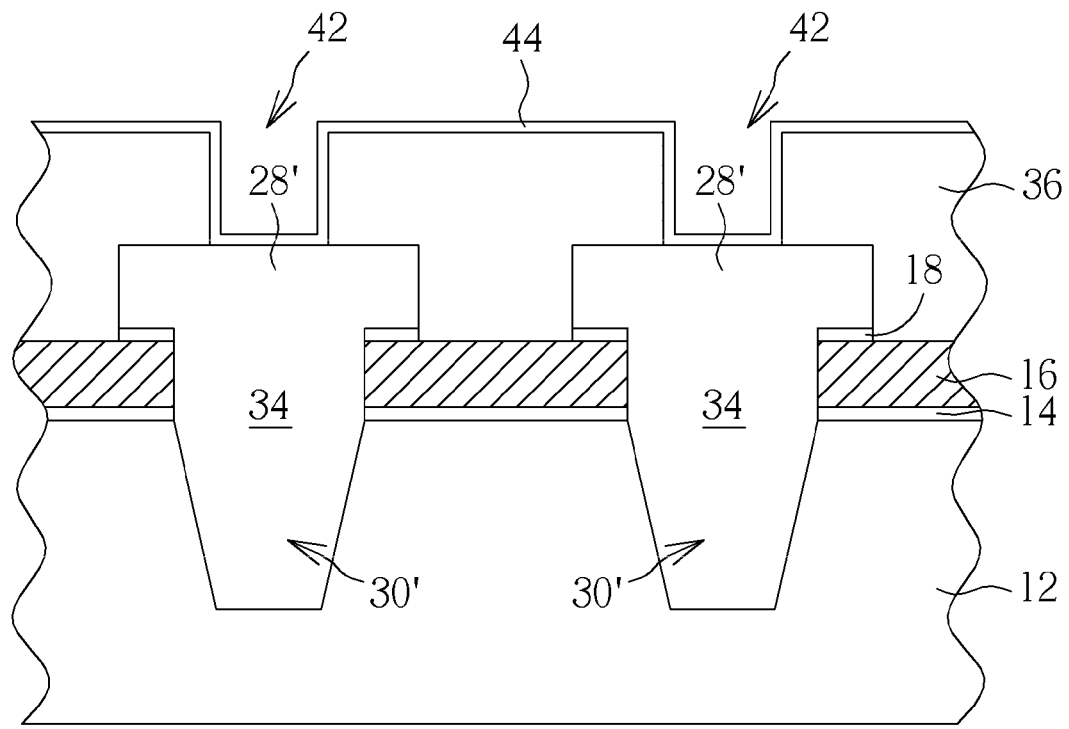
Figure 10:
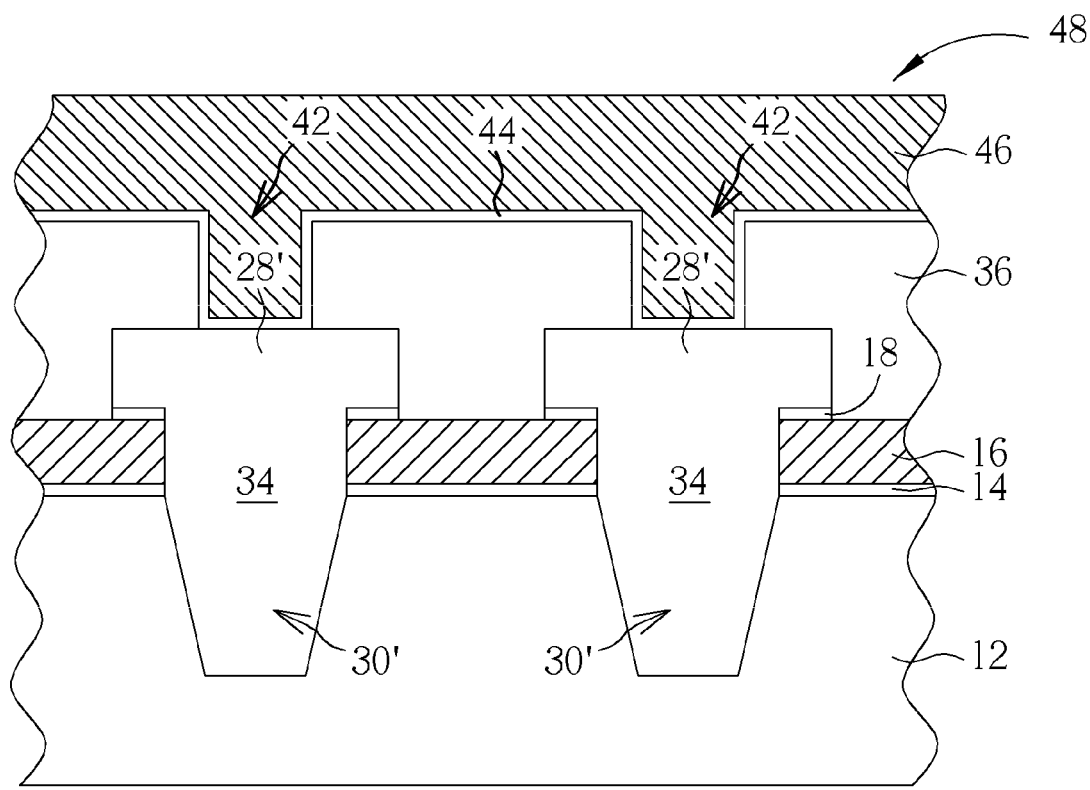

As shown in FIG. 9, a second dielectric layer 44 such as ONO is formed on the surface of the trench 42 and the surface of the second conductive layer 39. The second dielectric layer 44 will serve as a gate oxide layer after the flash memory is accomplished. After that, a patterned third conductive layer 46 serving as a control gate covers the second dielectric layer 44, and fills up the trench 42. The patterned third conductive layer 46 also serves as a word line. At this point, the flash memory 48 is finished. The flash memory 48 is constituted by the third conductive layer 46 serving as the control gate, the second conductive layer 36 and the first conductive layer 16 serving as the floating gate, the first dielectric layer 14 serving as the tunnel oxide layer, and the second dielectric layer 44 serving as the gate oxide layer.

Another fabricating method of a flash memory according to the second preferred embodiment of the present invention is provided. FIG. 11 to FIG. 15 are cross-sectional diagrams showing a fabricating method of a flash memory in accordance with the second preferred embodiment of this invention. For brevity, the elements denoted by the same numerals in the second preferred embodiment and the first preferred embodiment indicate the same devices, and an additional description is not further provided.

The difference between the first preferred embodiment and the second preferred embodiment is that, in the second preferred embodiment, the first width 28 of the trench 26 is defined by the second mask layer 20, the first mask layer 18 and the first conductive layer 16, and in the first preferred embodiment, the first width 28 of the trench 26 is defined by the second mask layer 20 only.

Figure 11:
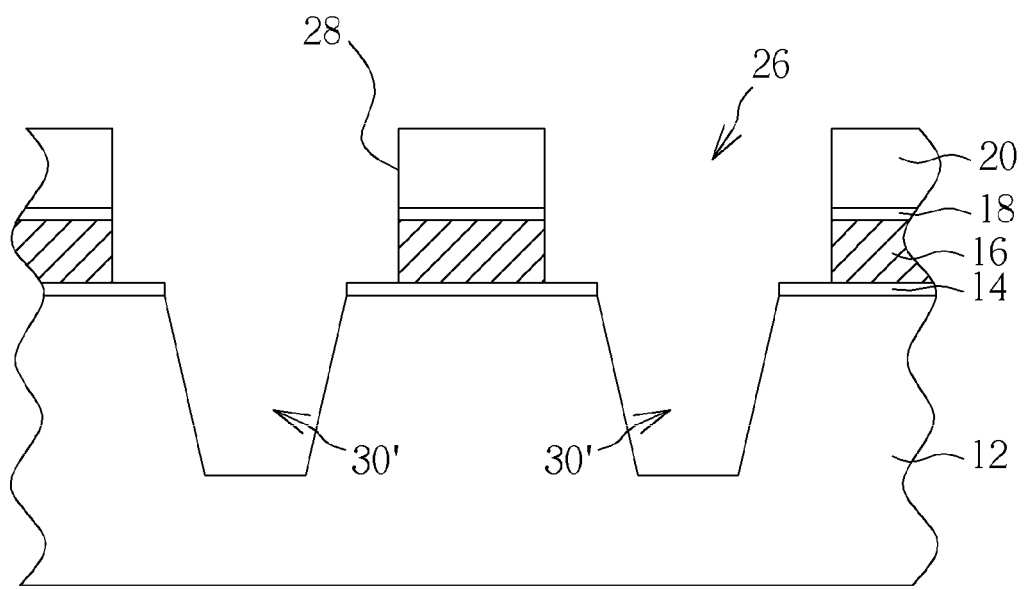
FIG. 11 to FIG. 15 are cross-sectional diagrams showing a fabricating method of a flash memory in accordance with the second preferred embodiment of this invention.

As shown in FIG. 11, a substrate 12 is provided. The substrate 12 is covered by a first dielectric layer 14, a first conductive layer 16, a first mask layer 18 and a second mask layer 20. After the conventional lithographic process, a trench 26 is formed in the second mask layer 20, the first mask layer 18, the first conductive layer 16, the first dielectric layer 14 and the substrate 12. A first width 28 of the trench 26 is defined by the second mask layer 20, the first mask layer 18, and the first conductive layer 16. A second width 30 of the trench 26 is defined by the first dielectric layer 14 and the substrate 12.

The method of forming the trench 26 in the second preferred embodiment is similar to that in the first preferred embodiment. As shown in FIG. 1, a trench 24 is formed by taking the patterned third mask layer 22 as mask. Then, the third mask layer 22 is removed. Next, as shown in FIG. 2a, the second mask layer 20 is pulled back. The following step is different from that in the first embodiment, in this embodiment, the first mask layer 18 and the first conductive layer 16 are etched by taking the second mask layer 20 after pulling back as a mask. In this way, the trench 26 depicted in FIG. 11 can be formed. An alternative method of forming the trench 26 in the second preferred embodiment is that: As shown in FIG. 1, a trench 24 is formed by taking the patterned third mask layer 22 as mask. Next, as show in FIG. 2b, the third mask layer 22 is shrinked to define the first width 28 by a trimming process or a dry etching process, after the trench 24 is formed. As show in FIG. 11, the second mask layer 20, the first mask layer 18, the first conductive layer 16 are etched by taking the third mask layer 22 as a mask and using the first dielectric layer 14 as a stop layer. At this point, the trench 26 is formed.

Figure 12:
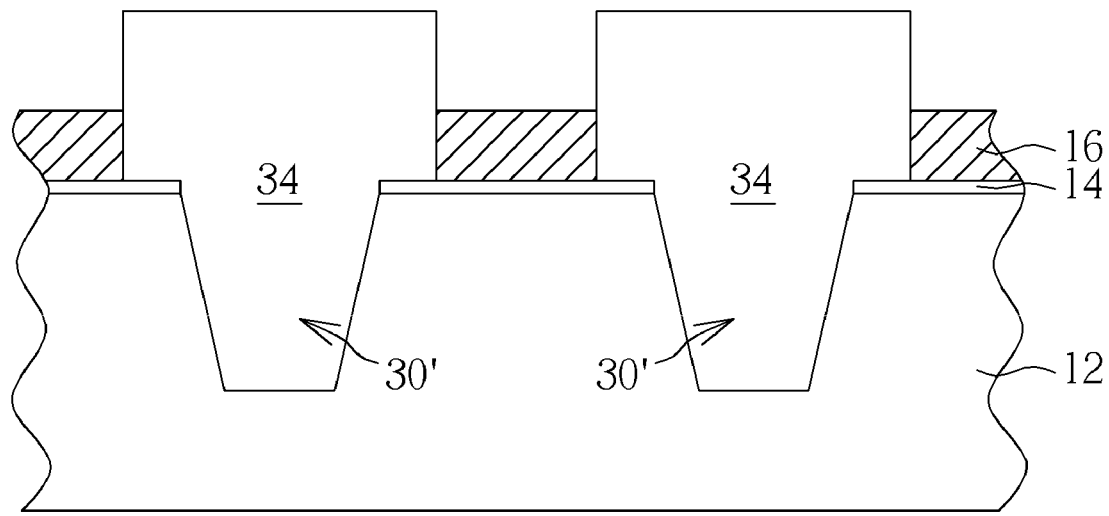

After the trench 26 is formed, as shown in FIG. 12, an insulating material 34 fills into the trench 26. Then, the surface of the insulating material 34 is planarized to align with the surface of the second mask layer 20. Next, the second mask layer 20 and first mask layer 18 are removed and the first conductive layer 16 is exposed.

Figure 13:
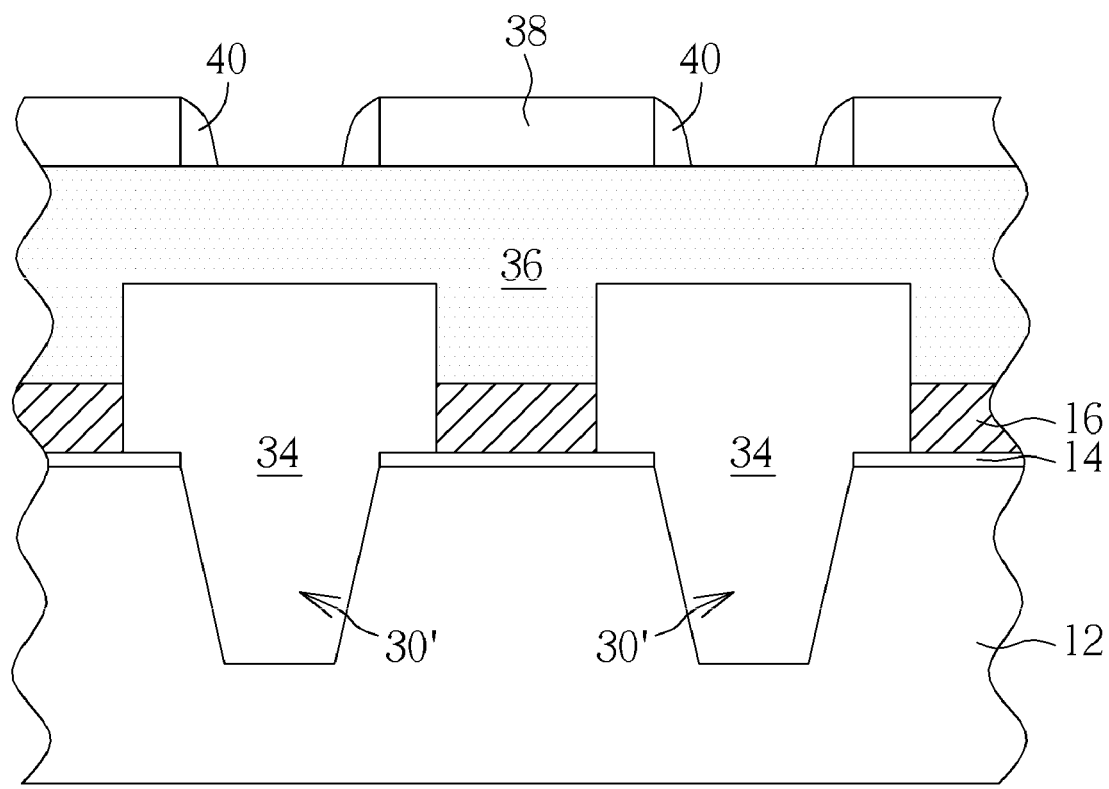
Figure 14:
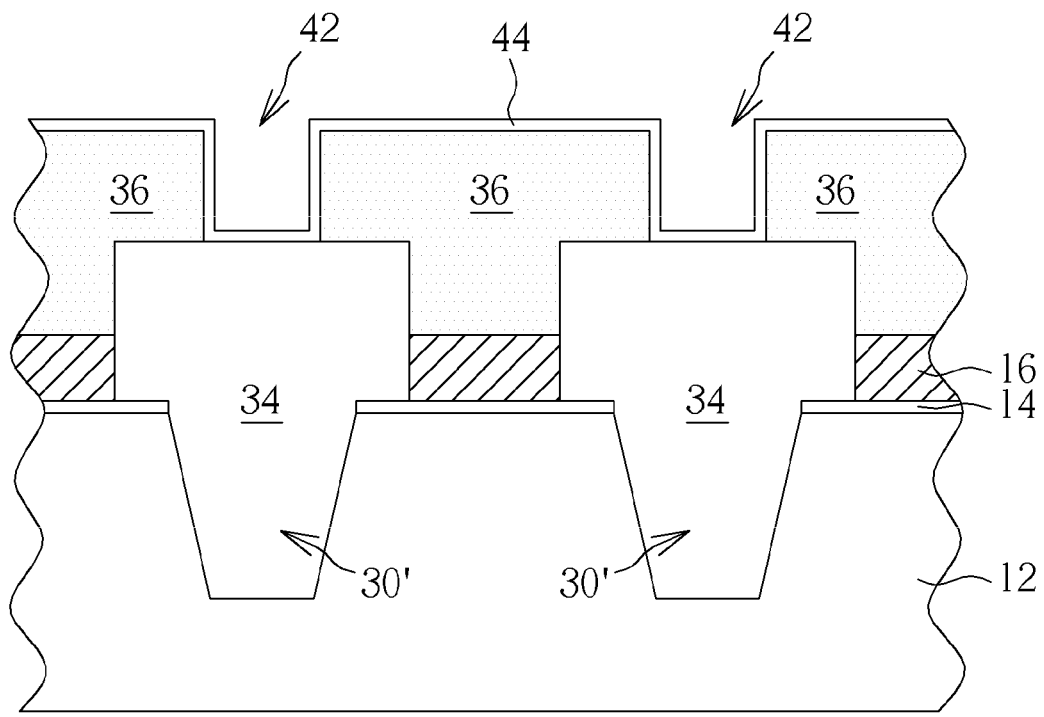
Figure 15:
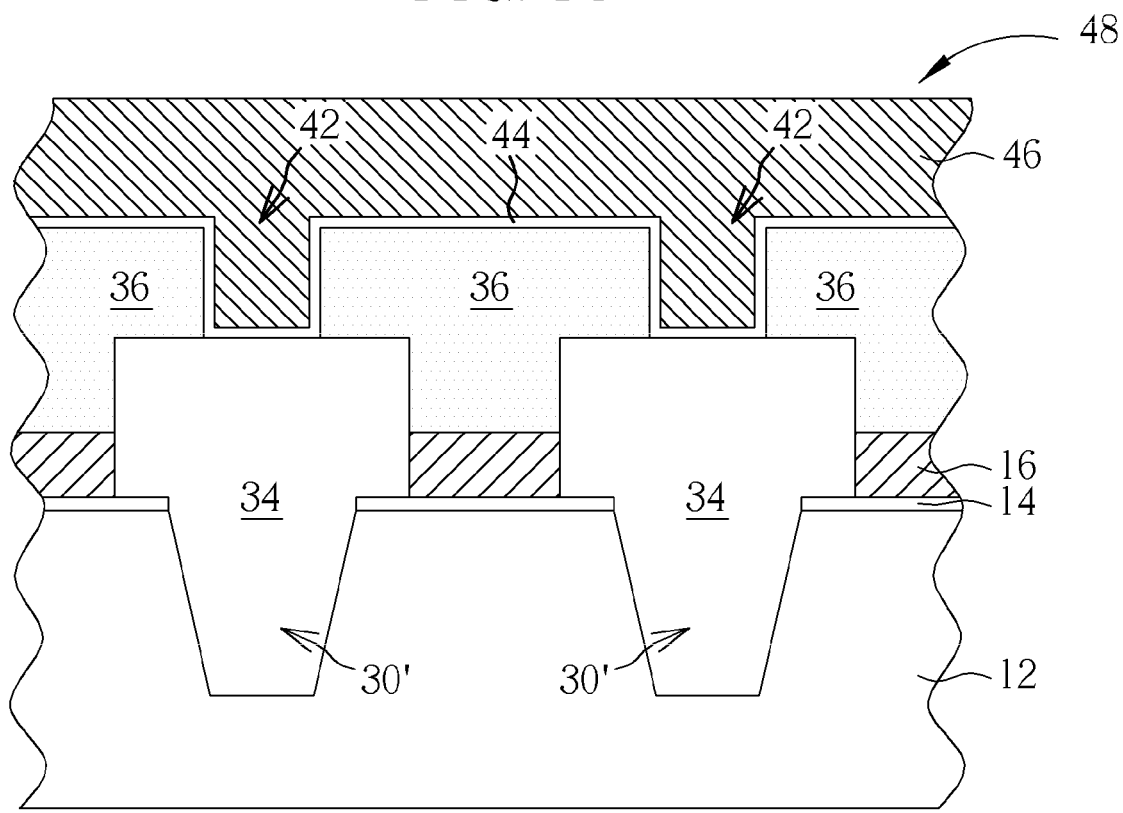

As shown in FIG. 13, a second conductive layer 36 covers the insulating material 34 and the first conductive layer 16. After that, a patterned fourth mask layer 38 and a spacer 40 at the side wall of the fourth mask layer 38 are formed. Next, as shown in FIG. 14, the second conductive layer 36 is etched to form a trench 42 by taking the fourth mask layer 38 and the spacer 40 as a mask. Then, a second dielectric layer 44 serving as a gate oxide layer is formed conformally on the surface of the trench 42 and the surface of the second conductive layer 36. Finally, as shown in FIG. 15, a patterned third conductive layer 46 serving as a control gate covers the second dielectric layer 44 and fills up the trench 42. At this point, the flash memory 48 of the second preferred embodiment is finished.

According to the first preferred embodiment of the second preferred embodiment, the present invention feature is that the trench 26 has a first width 28. The method of forming the first width 28 includes pulling back the second mask layer 20. Please refer to FIG. 6 and FIG. 8: by pulling back the second mask layer 20, the insulating material 34 filling in the trench 26 will form the width L on the first width 28' of the insulating material 34. Therefore, the width L can provide a greater alignment accuracy tolerance when the floating gate wing W is defined (i.e when the space 39 is defined).

Figure 16:
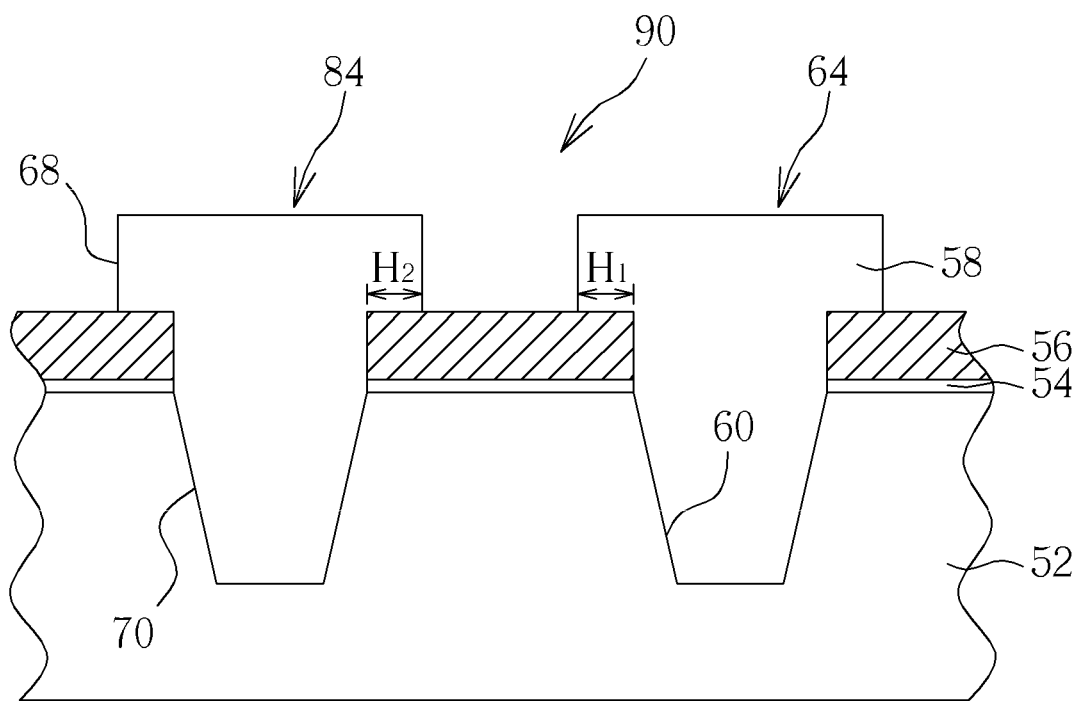
FIG. 16 to FIG. 17 show a cross sectional view of an insulating structure applied to a flash memory in accordance with the preferred embodiment of the present invention.
Figure 17:
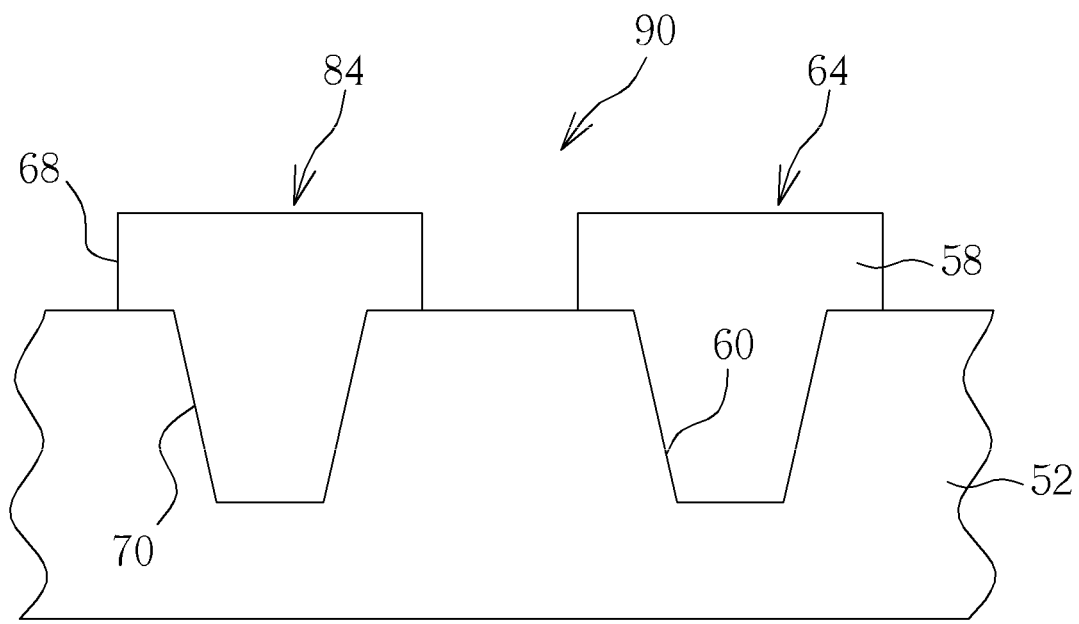

FIG. 16 to FIG. 17 show a cross sectional view of an insulating structure applied to a flash memory in accordance with the preferred embodiment of the present invention. As shown in FIG. 16, an insulating structure 90 includes a substrate 52 with a dielectric layer 54 and a conductive layer 56. The insulating structure 90 further includes a first insulating structure 64 and a second insulating structure 84. The first insulating structure 64 is next to the second insulating structure 84. The first insulating structure 64 includes a first bottom 60 and a first cap layer 58. The first bottom 60 is embedded in the substrate 52, the dielectric layer 54 and the conductive layer 56. The first cap layer 58 covers the conductive layer 56. In addition, the first cap layer 58 is wider than the first bottom 60. Therefore, the first insulating structure 64 constituted by the first bottom 60 and the first cap layer 58 forms a T shape.

The second insulating structure 84 includes a second bottom 70 and a second cap layer 68. The second bottom 70 is also embedded in the substrate 52, the dielectric layer 54 and the conductive layer 56. The second cap layer 68 covers the conductive layer 56. In addition, the second cap layer 68 is wider than the second bottom 70. Therefore, the second insulating structure 84 constituted by the second bottom 70 and the second cap layer 68 forms a T shape. Furthermore, the first cap layer 58 has a first horizontal protrusion $H_1$ which is the region of the first cap layer 58 wider than the first bottom 60. The second cap layer 68 has a second horizontal protrusion $H_2$ which is the region of the second cap layer 68 wider than the second bottom 70. The first horizontal protrusion $H_1$ and the second horizontal protrusion $H_2$ cover the conductive layer together.

The dielectric layer 54 can be silicon oxide. The conductive layer 56 can be polysilicon. The first insulating structure 64 and the second insulating structure 84 can be STI material such as silicon oxide.

As shown in FIG. 17, the conductive layer 56 and the dielectric layer 54 can be formed optionally. The spirit of the present invention lies in that a cap layer of the insulating structure covers on a substrate in which the bottom of the insulating structure is embedded. In addition, the bottom and the cap layer of the insulating structure form a T shape. Therefore, any modifications including a T-shaped insulating structure, and the cap layer of the insulating structure covering a substrate, obey the spirit of the present invention.

The first insulating structure 64 and the second insulating structure 84 can be STI. The difference between the conventional STI and the insulating structure of the present invention is that the insulating structure is T shaped, and a cap layer covers the substrate. However, the conventional STI does not have a cap layer on the substrate. Furthermore, the conventional STI is embedded completely in the substrate. The T-shaped insulating structure is not limited to only be applied to flash memory. It can also be applied to other semiconductor structures to replace STI, FOX, or other insulating materials. Moreover, if the insulating structure is used as STI in a flash memory, the alignment accuracy tolerance of the float gate wing can be improved.

Those skilled in the art will readily observe that numerous modifications and alterations of the device and method may be made while retaining the teachings of the invention.

What is claimed is:

1. A method for fabricating a flash memory, comprising:
    providing a substrate sequentially covered by a first dielectric layer, a first conductive layer, a first mask layer and a second mask layer;
    forming a first trench in the second mask layer, the first mask layer, the first conductive layer, the first dielectric layer and the substrate, wherein the first trench partly formed in the second mask layer has a first width, and the first trench partly formed in the first mask layer, the first conductive layer, the first dielectric layer and the substrate has a second width, wherein the first width is wider than the second width;
    filling up the first trench by an insulating material, the top surface of the insulating material being on the same plane with the top surface of the second mask layer;
    removing the second mask layer and a part of the first mask layer, and exposing the first conductive layer;
    forming a second conductive layer covering the first conductive layer and the insulating layer;
    forming a second trench in the second conductive layer, and exposing the top surface of the insulating material;
    forming a second dielectric layer conformally covering the surface of the second trench and the surface of the second conductive layer; and
    forming a third conductive layer covering the second dielectric layer and filling up the second trench.

2. The method of claim 1, wherein the first trench is formed by the following steps:
    forming a third mask layer covering the second mask layer;
    defining the third mask layer by a photo mask, and patterning the third mask layer;

utilizing the third mask layer as a first mask to pattern the second mask layer, the first mask layer, the first conductive layer, the first dielectric layer and the substrate to form a third trench;
removing the third mask layer; and
pulling back the second mask layer to define the first width of the first trench.

3. The method of claim 1, wherein the first trench is formed by the following steps:
forming a third mask layer covering the second mask layer;
defining the third mask layer by a photo mask, and patterning the third mask layer;
utilizing the third mask layer as a first mask to pattern the second mask layer, the first mask layer, the first conductive layer, the first dielectric layer and the substrate to form a third trench;
performing a trimming process to the third mask layer to define the first width of the first trench;
utilizing the trimmed third mask layer as a second mask, and etching the second mask layer; and
removing the third mask layer.

4. The method of claim 2, wherein the second trench is formed by the following steps:
forming a fourth mask layer on the second conductive layer;
defining the fourth mask layer by the photo mask, and patterning the fourth mask layer;
forming a spacer at a side of the patterned fourth mask layer;
utilizing the patterned fourth mask layer and the spacer as a second mask to etch the second conductive layer; and
removing the fourth mask layer.

5. The method of claim 3, wherein the second trench is formed by the following steps:
forming a fourth mask layer on the second conductive layer;
defining the fourth mask layer by the photo mask, and patterning the fourth mask layer;
forming a spacer at a side of the patterned fourth mask layer;
utilizing the patterned fourth mask layer and the spacer as a third mask to etch the second conductive layer; and
removing the fourth mask layer.

6. The method of claim 1, wherein the first width of the first trench and the second width of the first trench constitute a T shape.

7. The method of claim 1, wherein the first dielectric layer comprises silicon oxide, the first conductive layer comprises polysilicon, the first mask layer comprises silicon oxide and the second mask layer comprises silicon nitride.

8. The method of claim 1, wherein the insulating material serves as shallow trench insulation (STI).

9. The method of claim 1, wherein the second dielectric layer comprises ONO.

* * * * *